(12) United States Patent
Jakubowski et al.

(10) Patent No.: US 8,603,895 B1
(45) Date of Patent: Dec. 10, 2013

(54) METHODS OF FORMING ISOLATION STRUCTURES FOR SEMICONDUCTOR DEVICES BY PERFORMING A DEPOSITION-ETCH-DEPOSITION SEQUENCE

(75) Inventors: Frank Jakubowski, Dresden (DE); Joerg Radecker, Dresden (DE); Ralf Willecke, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/610,263

(22) Filed: Sep. 11, 2012

(51) Int. Cl.
*H01L 21/76* (2006.01)

(52) U.S. Cl.
USPC ..... 438/437; 438/424; 438/435; 457/E21.545

(58) Field of Classification Search
USPC .......................................... 438/424, 435, 437
See application file for complete search history.

(56) References Cited

U.S. PATENT DOCUMENTS

| | | | |
|---|---|---|---|
| 5,387,540 A * | 2/1995 | Poon et al. ..................... | 438/430 |
| 5,436,488 A * | 7/1995 | Poon et al. ..................... | 257/397 |
| 5,923,991 A | 7/1999 | Bronner et al. | |
| 6,319,794 B1 | 11/2001 | Akatsu et al. | |
| 6,479,368 B1 | 11/2002 | Mandelman et al. | |
| 6,518,148 B1 | 2/2003 | Cheng et al. | |
| 6,541,351 B1 | 4/2003 | Bartlau et al. | |
| 7,091,106 B2 | 8/2006 | Bonser et al. | |
| 7,838,355 B2 | 11/2010 | Anderson et al. | |
| 7,871,893 B2 | 1/2011 | Costrini et al. | |
| 8,030,172 B1 * | 10/2011 | Ahn et al. ..................... | 438/435 |
| 8,163,625 B2 | 4/2012 | Lin et al. | |
| 8,227,318 B2 | 7/2012 | Levy et al. | |
| 2005/0239257 A1 * | 10/2005 | Sato et al. ..................... | 438/296 |
| 2009/0068816 A1 * | 3/2009 | Eun .............................. | 438/425 |
| 2011/0129985 A1 * | 6/2011 | Pan .............................. | 438/438 |
| 2012/0267758 A1 * | 10/2012 | Shroff et al. .................. | 257/532 |

* cited by examiner

*Primary Examiner* — Alexander Ghyka
(74) *Attorney, Agent, or Firm* — Williams, Morgan & Amerson, P.C.

(57) ABSTRACT

In one example, the method includes forming a patterned etch mask above a semiconducting substrate, performing an etching process through the patterned etch mask to thereby form a trench in the substrate, performing a first deposition process to form a first layer of insulating material above the patterned etch mask and in the trench, and performing an etching process on the first layer of insulating material such that the post-etch thickness of the first layer of insulating material is less than an as-deposited thickness of the first layer of insulating material. The method also includes performing a second deposition process to form a second layer of insulating material on the etched first layer of insulating material, wherein the second layer of insulating material overfills the trench, and removing portions of the etched first layer of insulating material and the second layer of insulating material positioned above the patterned etch mask.

31 Claims, 5 Drawing Sheets

US 8,603,895 B1

METHODS OF FORMING ISOLATION STRUCTURES FOR SEMICONDUCTOR DEVICES BY PERFORMING A DEPOSITION-ETCH-DEPOSITION SEQUENCE

BACKGROUND OF THE INVENTION

1. Field of the Invention

Generally, the present disclosure relates to the manufacture of sophisticated semiconductor devices, and, more specifically, to various methods of forming isolation structures, such as trench isolation structures, for semiconductor devices by performing a novel deposition-etch-deposition process flow.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout. Field effect transistors (NMOS and PMOS transistors) represent one important type of circuit element used in manufacturing such integrated circuit devices. A field effect transistor, irrespective of whether an NMOS transistor or a PMOS transistor is considered, typically comprises doped source and drain regions that are formed in a semiconducting substrate that are separated by a channel region. A gate insulation layer is positioned above the channel region and a conductive gate electrode is positioned above the gate insulation layer. By applying an appropriate voltage to the gate electrode, the channel region becomes conductive and current is allowed to flow from the source region to the drain region.

To make an integrated circuit on a semiconducting substrate, the various semiconductor devices, e.g., transistors, capacitors, etc., are electrically isolated from one another by so-called isolation structures. Currently, most sophisticated integrated circuit devices employ so-called shallow trench isolation (STI) structures. As the name implies, STI structures are made by forming a relatively shallow trench in the substrate and thereafter filling the trench with an insulating material, such as silicon dioxide. One technique used to form STI structures initially involves growing a pad oxide layer on the substrate and depositing a pad nitride layer on the pad oxide layer. Thereafter, using traditional photolithography and etching processes, the pad oxide layer and the pad nitride layer are patterned. Then, an etching process is performed to form a trench in the substrate for the STI structure using the patterned pad oxide layer and pad nitride layer as an etch mask. Thereafter, a deposition process, such as the well-known High Aspect Ratio Process (HARP) offered by Applied Materials, is performed to overfill the trenches with an insulating material such as silicon dioxide. The deposited silicon dioxide material in the process is then typically densified by subjecting it to an anneal process in a furnace, e.g., about 1000° C. for a duration of about 30 minutes. The purpose of the densification process is to increase the etch resistance of the silicon dioxide material to later wet etching processes. Thereafter, a chemical mechanical polishing (CMP) process is then performed using the pad nitride layer as a polish stop layer to remove the excess insulation material positioned outside of the trenches. Then, a subsequent deglazing (etching) process may be performed to insure that the silicon dioxide insulating material is removed from the surface of the pad nitride layer. This deglaze process may remove some of material of the STI structures. Thereafter, a wet nitride strip process, e.g., a hot phosphoric acid process, is performed to selectively remove the pad nitride layer relative to the pad oxide layer and the STI structure. If desired, the pad oxide layer may also be removed at this time by performing a quick wet etching process using a dilute HF chemistry. Alternatively, the pad oxide layer may be left in place or removed at a later point in the process flow.

Numerous processing operations are performed in a very detailed sequence, or process flow, to form integrated circuit devices, e.g., deposition processes, etching processes, heating processes, masking operations, etc. One problem that arises with current processing techniques is that, after the STI regions are formed, at least portions of the STI regions are exposed to many subsequent etching or cleaning processes that tend to consume, at least to some degree, portions of the STI structures subjected to such etching processes. The attacks are not uniform across the surface of the STI structure due to, for example, masking only certain portions of the STI structure during some etching processes. As a result, there is an uneven loss of material in the STI structure, sometimes referred to as "divots."

FIG. 1 is a scanning electron microscope image of an illustrative prior art STI structure 11. The STI structure 11 is formed in a substrate 13 by performing the processing generally described above, i.e., the trench is formed in the substrate 13 and thereafter filled with an insulating material by performing a single HARP deposition process. At the point depicted in FIG. 1, an illustrative gate structure has been formed above the substrate 13 and the STI structure 11. The view in FIG. 1 is a cross-sectional view of the gate structure taken along a direction that would correspond to the gate width direction of a transistor device. As depicted therein, various layers of material that make up the gate structure have been formed across the substrate 11: a gate insulation layer 15 (e.g., silicon dioxide), a high-k layer of insulating material 17 (a material having a k value greater than 10), a metal layer 19 (e.g., titanium nitride) and a layer of polysilicon 21. The upper surface of the STI structure 11 has a plurality of divots 11A, 11B located adjacent the substrate 13 and a relatively flat central section 11F located between the two divots 11A, 11B. In this example, relative to the upper surface of the substrate 13, the divots 11A, 11B may have a depth of about 6.9 nm and 7.5 nm, respectively. The relatively flat surface 11F may be positioned about 6 nm above the surface of the substrate 13.

Divots, such as the illustrative divots 11A, 11B depicted in FIG. 1, can be problematic for several reasons. If the depth of the divots are too great, the chances that there may be a loss of gate encapsulation as processing continues may occur. The presence of such divots may cause an increase in the degree of undesirable "footing" of the gate materials when they are patterned to define the gate structure. In some cases, the depth of the divots may be so great that there is a risk of incomplete etching for one or more of the conductive materials in the gate structure such that there is a short-circuit created between adjacent gate structures. Such a situation is sometimes referred to as the creation of undesirable "poly stringers" between adjacent gate structures. As a result, the STI structures may not perform their isolation function as intended, which may result in problems such as increased leakage currents, device failure, etc.

The present disclosure is directed to various methods of forming isolation structures that may eliminate or at least reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming isolation structures, such as trench isolation structures, for semiconductor devices by performing a novel deposition-etch-deposition process flow. In one example, the method includes forming a patterned etch mask above a semiconducting substrate, performing an etching process through the patterned etch mask to thereby form a trench in the substrate, performing a first deposition process to form a first layer of insulating material above the patterned etch mask and in the trench and performing an etching process on the first layer of insulating material such that the post-etch thickness of the first layer of insulating material is less than an as-deposited thickness of the first layer of insulating material. In this example, the method also includes performing a second deposition process to form a second layer of insulating material on the etched first layer of insulating material, wherein the second layer of insulating material overfills the trench, and removing portions of the etched first layer of insulating material and the second layer of insulating material positioned above the patterned etch mask.

BRIEF DESCRIPTION OF THE DRAWINGS

The disclosure may be understood by reference to the following description taken in conjunction with the accompanying drawings, in which like reference numerals identify like elements, and in which.

Figure 1:
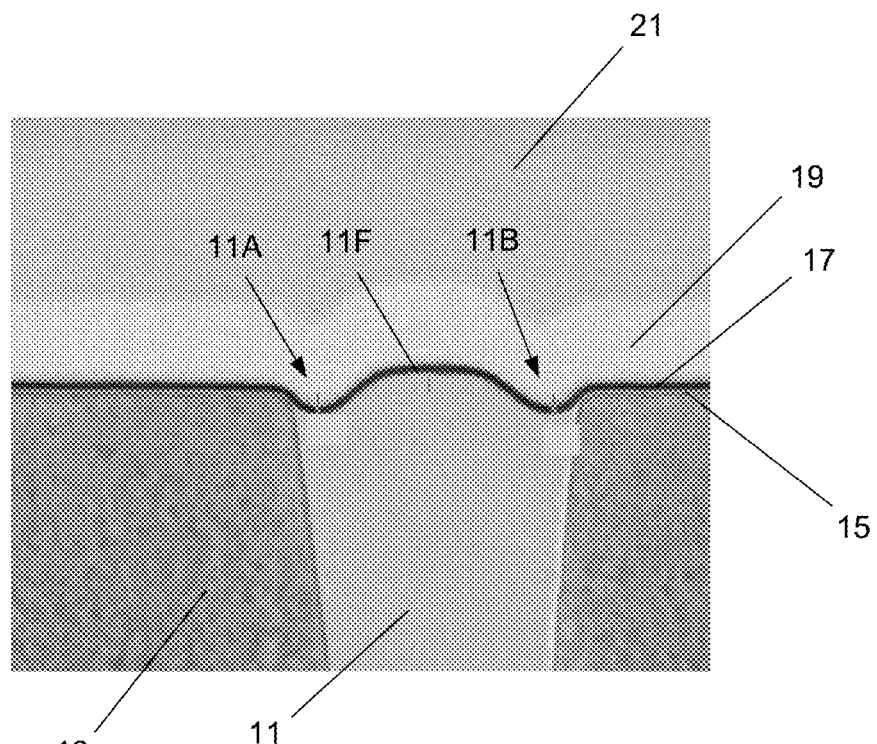
FIG. 1 is an SEM image of an illustrative prior art isolation structure for a semiconductor device after additional structures have been formed above the prior art isolation structure.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming isolation structures, such as trench isolation structures, for semiconductor devices by performing a novel deposition-etch-deposition process flow. As will be readily apparent to those skilled in the art upon a complete reading of the present application, the present method is applicable to a variety of devices, including, but not limited to, logic devices, memory devices, etc. With reference to the attached drawings, various illustrative embodiments of the methods and devices disclosed herein will now be described in more detail.

Figure 2A:
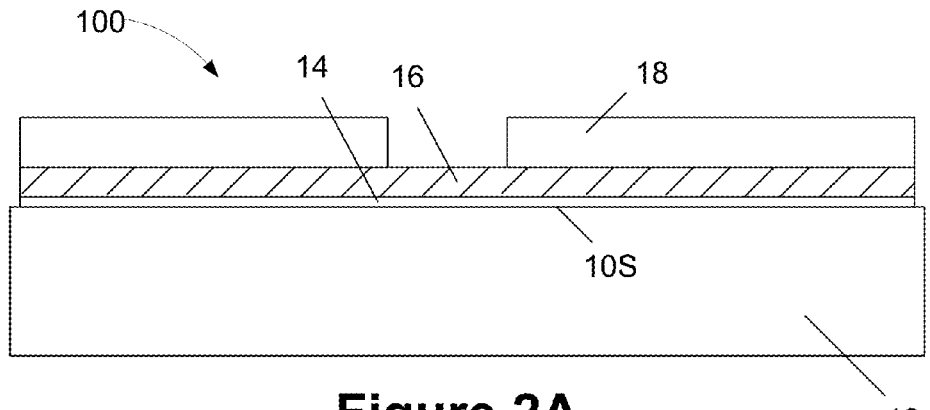
FIGS. 2A-2I depict one illustrative method disclosed herein for forming isolation structures for semiconductor devices.

FIG. 2A is a simplified view of an illustrative semiconductor device 100 at an early stage of manufacturing. The semiconductor device 100 is formed above an illustrative bulk semiconducting substrate 10 having an upper surface 10S. The substrate 10 may have a variety of configurations, such as the depicted bulk silicon configuration. The substrate 10 may also have a silicon-on-insulator (SOI) configuration that includes a bulk silicon layer, a buried insulation layer and an active layer, wherein semiconductor devices are formed in and above the active layer. Thus, the terms substrate or semiconductor substrate should be understood to cover all forms of semiconductor structures. The substrate 10 may also be made of materials other than silicon.

In FIG. 2A, the device 100 is depicted at the point of fabrication where an illustrative protection layer 14, e.g., a screen or pad oxide layer, and a polish stop layer 16, e.g., a pad nitride layer, have been formed above the substrate 10. Also depicted in FIG. 2A is a patterned mask layer 18, e.g., a patterned photoresist mask that may be formed using traditional photolithography tools and techniques. In one illustrative example, the protection layer 14 may be a pad oxide layer having a thickness on the order of about 10 nm, and it may be formed by performing a thermal growth process. In one illustrative example, the polish stop layer 16 may be a pad nitride layer having a thickness on the order of about 80 nm, and it may be formed by performing a chemical vapor deposition (CVD) process.

Figure 2B:
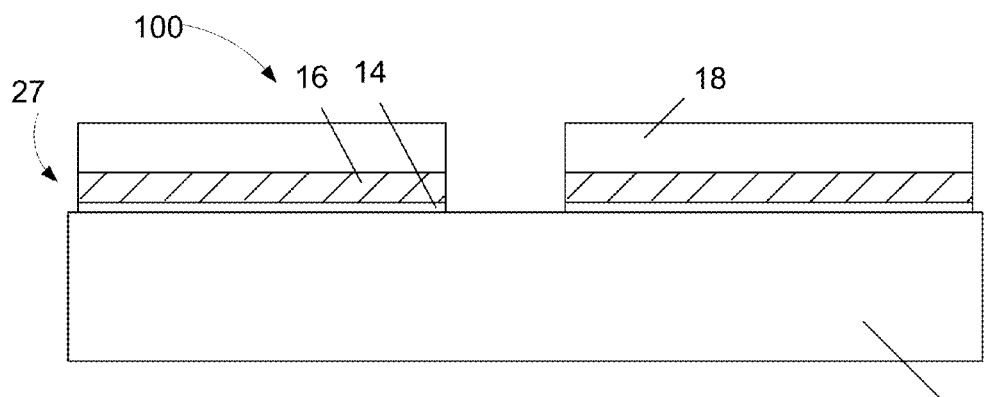
Figure 2C:
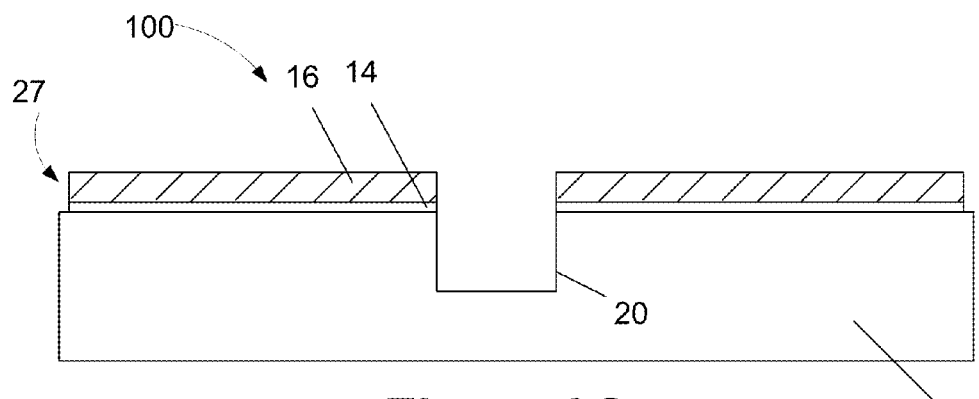

Thereafter, as shown in FIG. 2B, one or more etching processes, such as reactive ion etching processes, are performed through the mask layer 18 to pattern the protection layer 14 and the polish stop layer 16. Collectively, the patterned protection layer 14 and the patterned polish stop layer 16 may be considered to be a patterned etch mask 27.

FIG. 1C depicts the device 100 after the masking layer 18 has been removed and an etching process, such as a reactive ion etching process, has been performed to form a trench 20 in the substrate 10 using the patterned etch mask 27, i.e., the patterned protection layer 14 and polish stop layer 16, as an etch mask. For ease of illustration, the trench 20 is depicted as having a generally rectangular cross-section. In real-world devices, the sidewalls of the trench 20 will likely be somewhat inwardly tapered. The dimensions of the trench 20 may vary depending on the particular application. In current day devices, the trench 20 may have a depth of about 100-400 nm and a width (at the top of the trench) of about 30 nm up to several micrometers.

Figure 2D:
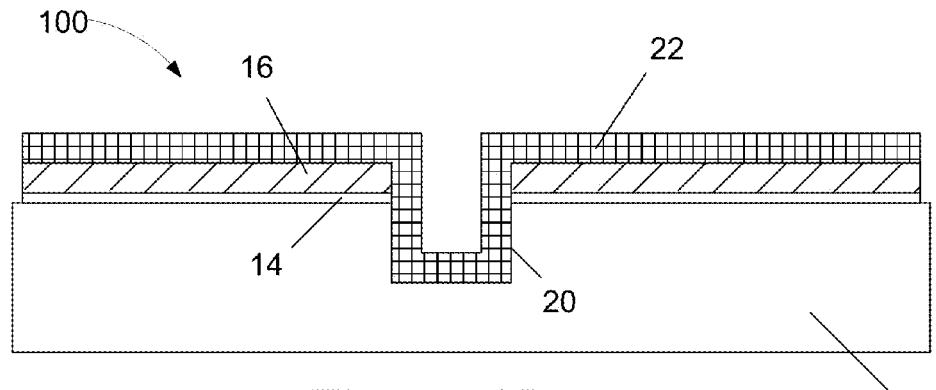

Next, as shown in FIG. 2D, a first deposition process is performed to deposit a first layer of insulating material 22. In one embodiment, the first layer of insulating material 22 is formed to such a thickness such that it does not completely fill the trench 20. In some applications, the first layer of insulating material 22 may have an as-deposited thickness of about 5-40 nm. The first layer of insulating material 22 may be comprised of a variety of different insulating materials, such as silicon dioxide, silicon nitride, etc. The first layer of insulating material 22 may be formed using a variety of techniques, e.g., HDP (High Density Plasma) oxide process (preferred), HARP (High Aspect Ratio Process) oxide process, chemical vapor deposition (CVD), atomic layer deposition (ALD), spin-on-glass (SOG) process, etc., or plasma-enhanced versions of those processes. In one illustrative example, the first layer of insulating material 22 is a layer of silicon dioxide that is formed by performing an HDP deposition process using a high ratio of ozone ($O_3$) and TEOS, as well as a relatively low flow rate of TEOS. In one particular embodiment, a deposition process with a relatively low deposition rate, e.g., less than about 6-24 nm/min, may be employed to form the first layer of insulating material 22.

Figure 2E:
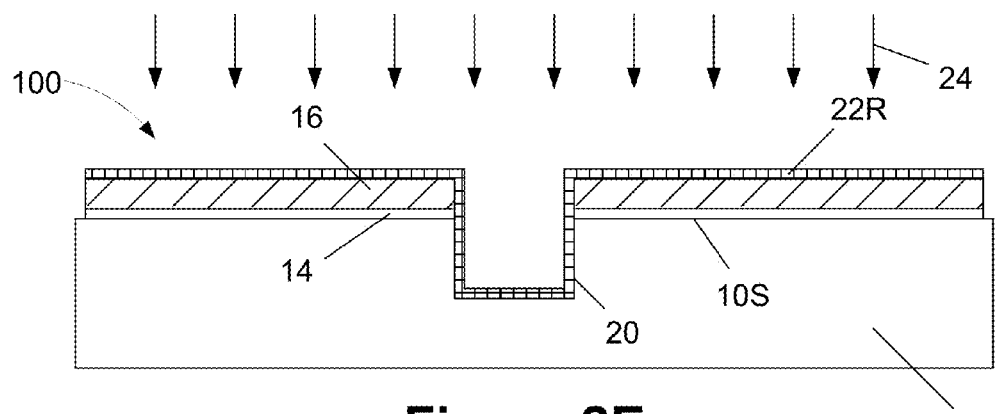

Then, as shown in FIG. 2E, in one illustrative example, using the techniques disclosed herein, a timed etching process 24, either dry or wet, is performed to reduce the as-deposited thickness of the first layer of insulating material 22 and thereby define a reduced thickness first layer of insulating material 22R. In some cases, the post-etch thickness of the reduced thickness first layer of insulating material 22R may be about 20-70% of the as-deposited thickness of the first layer of insulating material 22. In one particular example, the etching process 24 may be a dry reactive ion etching process that produces a reduced thickness first layer of insulating material 22R having a thickness of about 2-28 nm after the etching process 24 is complete.

Figure 2F:
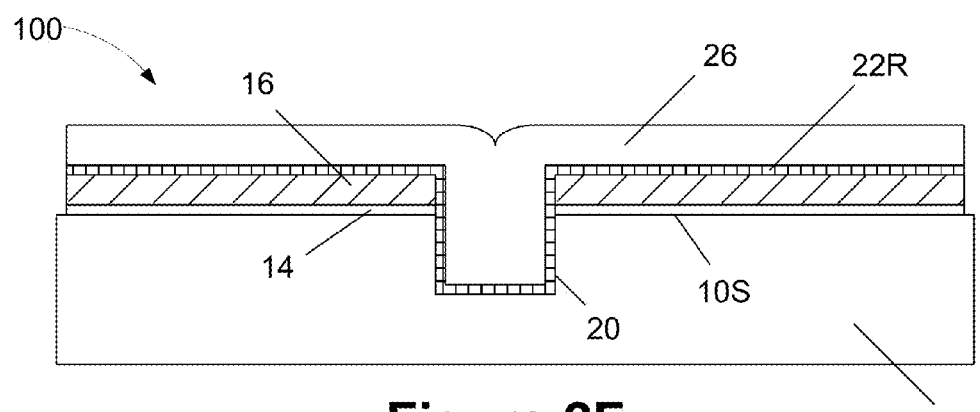

Next, as shown in FIG. 2F, a second deposition process is performed to deposit a second layer of insulating material 26 on the reduced thickness first layer of insulating material 22R. The second layer of insulating material 26 is deposited to an appropriate thickness such that it overfills the trench 20. The second layer of insulating material 26 may be comprised of a variety of different insulating materials, such as silicon dioxide, silicon nitride, etc. Moreover, the second layer of insulating material 26 may be made of the same material as that of the first layer of insulating material 22 or it may be made of a different material than that of the first layer of insulating material 22. The second layer of insulating material 26 may be formed using a variety of techniques, e.g., HDP (High Density Plasma) oxide process, HARP (High Aspect Ratio Process) oxide process, chemical vapor deposition (CVD), an SOG process, atomic layer deposition (ALD), etc., or plasma-enhanced versions of those processes. In one illustrative example, the second layer of insulating material 26 is a layer of silicon dioxide that is formed using the well-known HARP deposition process offered by Applied Materials. In one embodiment, the formation of the second layer of insulating material 26 may involve performing a first portion of the second deposition process such that material is deposited at a relatively low deposition rate, e.g., less than about 18-24 nm/min, followed by at least a second portion of the second deposition process whereby the deposition rate of the material is increased to a rate above the relatively low deposition rate mentioned above. In one specific example, where the depth of the trench 20 is about 500 nm, the first portion, i.e., the low deposition rate portion, of the second deposition process may be performed for about 5 minutes (to produce a 90-120 nm thick portion of the second layer of insulating material 26) and thereafter the deposition rate of the second deposition process may be increased to about 150-200 nm/min and performed about 2-3 minutes to overfill the trench 20.

Thereafter, if desired, a densification process, i.e., an anneal process, may be performed on the device 100 to densify the insulation materials that will make up the final STI structure for the device 100. The parameters of such an anneal process may vary depending upon the particular application. In one illustrative example, the anneal process may be a furnace-based anneal process performed at a temperature within the range of about 1000-1100° C. for a duration of about 30 minutes.

Figure 2G:
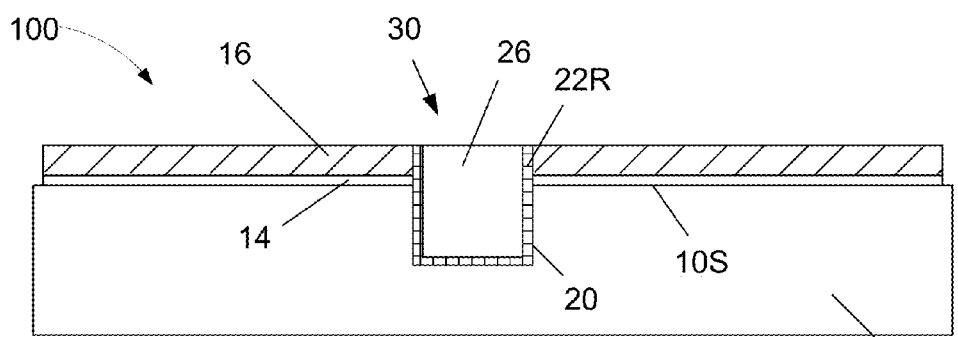

Next, as shown in FIG. 2G, one or more CMP processes are performed to remove the portions of the reduced thickness first layer of insulating material 22R and the second layer of insulating material 26 that are positioned outside of the trench 20 and above the surface of the polish stop layer 16. This results in the formation of the overall trench isolation structure 30 for the device 100. Thereafter, an etching or deglazing process is performed to insure that the surface of the polish stop layer 16 is free of any remnants of the layers of insulating material 22R, 26. This deglaze process may reduce the thickness or height of the isolation structure 30 slightly, but such thickness reduction is not depicted in FIG. 2G.

Figure 2H:
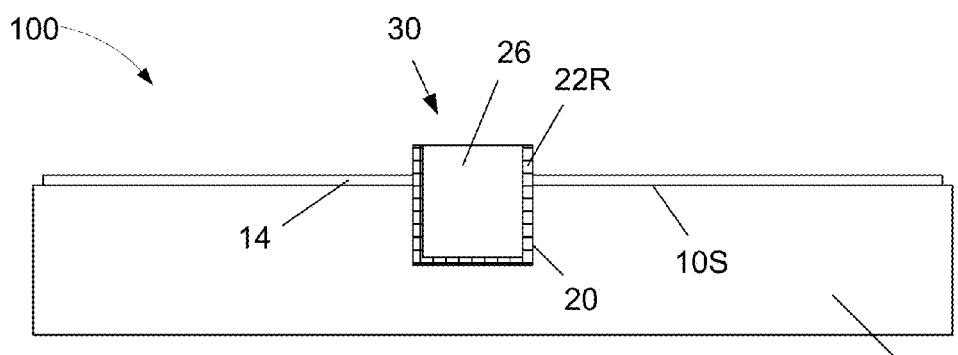

Then, as shown in FIG. 2H, one or more etching processes, e.g., a wet etching process using hot phosphoric acid, is performed to remove the polish stop layer 16. If desired, the protection layer 14 may also be removed at this time by performing a quick wet etching process using a dilute HF chemistry. Alternatively, the protection layer 14 may be left in place or removed at a later point in the process flow.

Figure 2I:
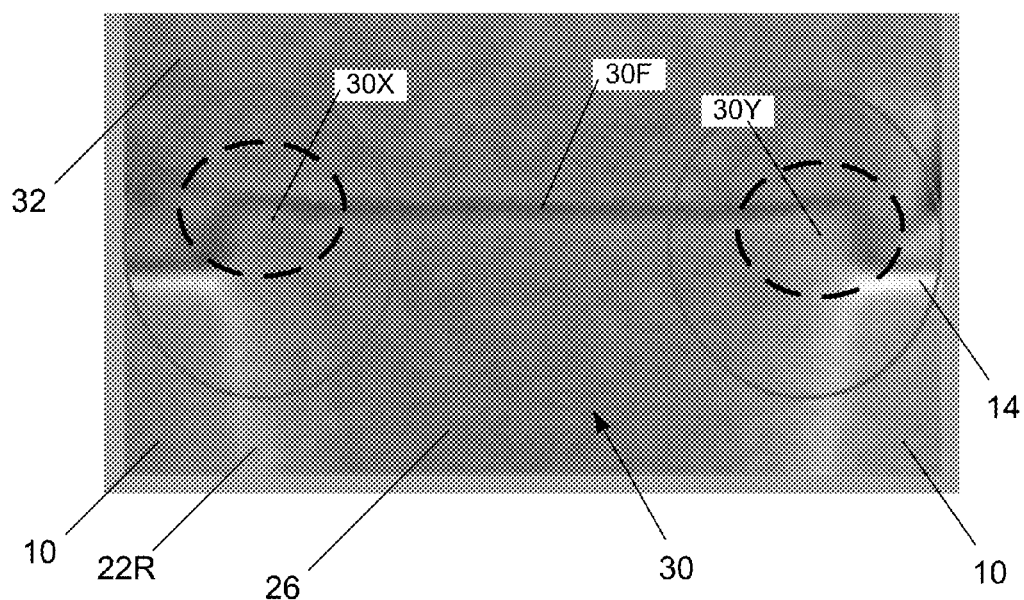

FIG. 2I is a scanning electron microscope image of one embodiment of the novel isolation structure 30 disclosed herein directly after the formation of the isolation structure 30. The isolation structure 30 was formed in the substrate 10 by performing the processing generally described above, i.e., the deposition-etch-deposition sequence described above. The isolation structure 30 is comprised of the reduced thickness first layer of insulating material 22R and the second layer of insulating material 26. At the point depicted in FIG. 2I, an illustrative decoration layer 32 has been formed for SEM contrast purposes. The view in FIG. 2I is a cross-sectional view of the isolation structure 30 that is taken along a direction that would correspond to the gate width direction of a transistor device. As depicted therein, the upper surface of the STI structure 30 has a plurality of bumps 30X, 30Y located adjacent the substrate 10 and a relatively flat central section 30F located between the two bumps 30X, 30Y. The bumps 30X, 30Y appear on the STI structure 30 after it has been exposed to various cleaning/etching processes as a semiconductor device is fabricated. Given the relatively low deposition rate used in forming the first layer of insulating material 22 and in forming the first part of the second layer of insulating material 26, the insulating materials near the sidewalls of the trench 20 are more dense, and thus have an increased etch resistance, as compared to the insulating material in the middle of the isolation structure 30. As a result, as a device is being manufactured, the insulating materials near the sidewalls of the trench 20 do not etch as fast as the less dense insulating material in the middle of the isolation structure 30. This results in the formation of the bumps 30X, 30Y. In effect, the bumps 30X, 30Y help to reduce the depth of any divots that may be formed in the isolation structure 30 as discussed below in connection with FIG. 3.

Figure 3:
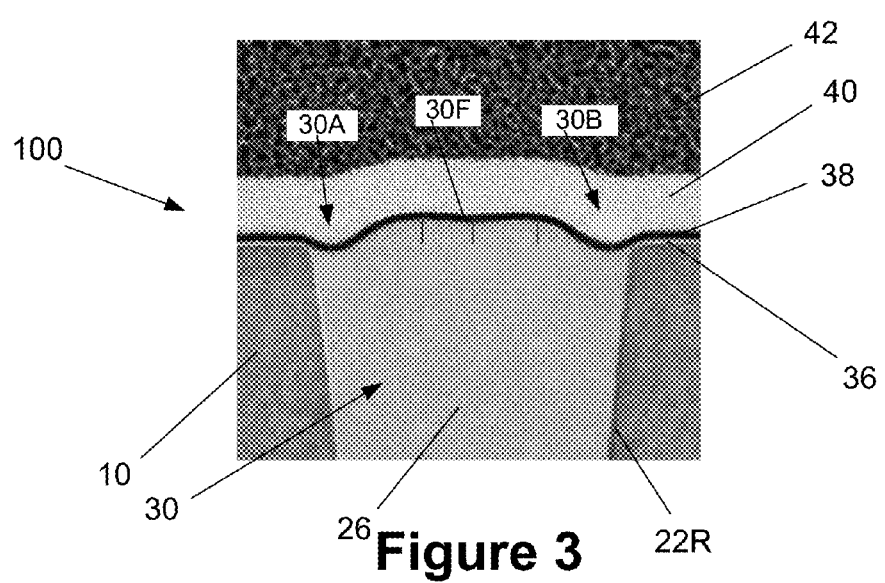
FIG. 3 is an SEM image of an illustrative embodiment of an isolation structure for a semiconductor device that may be formed as described herein after additional structures have been formed above the isolation structure.

FIG. 3 is a scanning electron microscope image of one embodiment of the novel isolation structure 30 disclosed herein after various structures have been formed above the isolation structure 30. The isolation structure 30 was formed in the substrate 10 by performing the processing generally described above, i.e., the deposition-etch-deposition sequence described above. The isolation structure 30 is comprised of the reduced thickness first layer of insulating material 22R and the second layer of insulating material 26. At the point depicted in FIG. 3, an illustrative gate structure has been formed above the substrate 10 and the isolation structure 30. The view in FIG. 3 is a cross-sectional view of the isolation structure 30 that is taken along a direction that would correspond to the gate width direction of a transistor device. As depicted therein, various layers of material that make up the gate structure have been formed across the substrate 10 and the isolation structure 30: a gate insulation layer 36 (e.g., silicon dioxide), a high-k layer of insulating material 38 (an insulating material having a k value greater than 10), a metal layer 40 (e.g., titanium nitride) and a layer of polysilicon 42. The upper surface of the isolation structure 30 has a plurality of divots 30A, 30B located adjacent the substrate 10 and a relatively flat central section 30F located between the two divots 30A, 30B. In this example, relative to the upper surface of the substrate 10, the divots 30A, 30B have a depth of about 2.2 nm and 2.6 nm, respectively. The relatively flat surface 30F may be positioned about 7 nm above the surface of the substrate 10. In general, the divots 30A, 30B in the novel isolation structure 30 after the patterning of the gate structure, are significantly shallower than the divots 11A, 11B formed in the prior art STI structure 11, as shown in FIG. 1. Recall that the divots 11A, 11B in the prior art STI structure 11 had a depth of about 6.9 nm and 7.5 nm, respectively, whereas the divots 30A, 30B in the novel isolation structure 30 disclosed herein have a depth of about 2.2 nm and 2.6 nm, respectively. This significant reduction in the depth of the divots 30A, 30B may help reduce or eliminate one or more of the problems identified in the background section of this application.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a patterned etch mask above a semiconducting substrate;
    performing an etching process through said patterned etch mask to thereby form a trench in said substrate;
    performing a first deposition process to form a first layer of insulating material above said patterned etch mask and in said trench, said first layer of insulating material having an as-deposited thickness;
    performing an etching process on said first layer of insulating material such that, after said etching process has been performed, said first layer of insulating material has a post-etch thickness that is less than said as-deposited thickness;
    after performing said etching process, performing a second deposition process to form a second layer of insulating material on said etched first layer of insulating material, wherein said second layer of insulating material overfills said trench; and
    removing portions of said etched first layer of insulating material and said second layer of insulating material positioned above said patterned etch mask.

2. The method of claim 1, wherein performing said first deposition process comprises performing said first deposition process such that a first deposition rate during said first deposition process is less than 24 nm/min.

3. The method of claim 2, wherein performing said first deposition process comprises performing a HARP deposition process.

4. The method of claim 2, wherein performing said first deposition process comprises performing said first deposition process using TEOS.

5. The method of claim 1, wherein said patterned etch mask is comprised of a layer of silicon dioxide formed on said substrate and a layer of silicon nitride formed on said layer of silicon dioxide.

6. The method of claim 1, wherein said first layer of insulating material and said second layer of insulating material are comprised of the same insulating material.

7. The method of claim 6, wherein said first and second layers of insulating material are silicon dioxide.

8. The method of claim 1, wherein said first layer of insulating material and said second layer of insulating material are comprised of different insulating materials.

9. The method of claim 1, wherein performing said second deposition process comprises performing said second deposition process such that a second deposition rate during a first portion of said second deposition process is less than 24 nm/min.

10. The method of claim 9, wherein, after performing said first portion of said second deposition process, performing said second deposition process such that the deposition rate after said first portion of said second deposition process is greater than said second deposition rate.

11. The method of claim 1, wherein performing said second deposition process comprises performing said second deposition process using TEOS.

12. The method of claim 1, wherein performing said etching process on said first layer of insulating material comprises performing a dry reactive ion etching process on said first layer of insulating material.

13. The method of claim 1, wherein said post-etch thickness of said first layer of insulating material is about 40-70% of said as-deposited thickness of said first layer of insulating material.

14. The method of claim 1, wherein removing said portions of said etched first layer of insulating material and said second layer of insulating material positioned above said patterned etch mask comprises performing at least one chemical mechanical polishing process to remove said portions of said etched first layer of insulating material and said second layer of insulating material positioned above said patterned etch mask.

15. A method, comprising:
- forming a patterned etch mask above a semiconducting substrate;
- performing an etching process through said patterned etch mask to thereby form a trench in said substrate;
- performing a first deposition process at a first deposition rate of less than 24 nm/min to form a first layer of insulating material above said patterned etch mask and in said trench, said first layer of insulating material having an as-deposited thickness;
- performing an etching process on said first layer of insulating material such that, after said etching process has been performed, said first layer of insulating material has a post-etch thickness that is about 40-70% of said as-deposited thickness;
- after performing said etching process, performing a second deposition process to form a second layer of insulating material on said etched first layer of insulating material, wherein said second layer of insulating material overfills said trench; and
- removing portions of said etched first layer of insulating material and said second layer of insulating material positioned above said patterned etch mask.

16. The method of claim 15, wherein performing said first deposition process comprises performing said first deposition process using TEOS and ozone.

17. The method of claim 15, wherein performing said second deposition process comprises performing said second deposition process using TEOS and ozone.

18. The method of claim 15, wherein performing said second deposition process comprises performing said second deposition process such that a second deposition rate during a first portion of said second deposition process is less than 24 nm/min.

19. The method of claim 18, wherein, after performing said first portion of said second deposition process, performing said second deposition process such that the deposition rate after said first portion of said second deposition process is greater than said second deposition rate.

20. A method, comprising:
- forming a patterned etch mask above a semiconducting substrate;
- performing an etching process through said patterned etch mask to thereby form a trench in said substrate;
- performing a first deposition process at a first deposition rate of less than 24 nm/min to form a first layer of insulating material above said patterned etch mask and in said trench, said first layer of insulating material having an as-deposited thickness;
- performing an etching process on said first layer of insulating material such that, after said etching process has been performed, said first layer of insulating material has a post-etch thickness that is less than said as-deposited thickness;
- after performing said etching process, performing a second deposition process to form a second layer of insulating material on said etched first layer of insulating material, wherein said second layer of insulating material overfills said trench and wherein performing said second deposition process comprises performing said second deposition process such that a second deposition rate during a first portion of said second deposition process is less than 24 nm/min; and
- removing portions of said etched first layer of insulating material and said second layer of insulating material positioned above said patterned etch mask.

21. The method of claim 20, wherein performing said first deposition process comprises performing said first deposition process using TEOS and ozone.

22. The method of claim 20, wherein performing said second deposition process comprises performing said second deposition process using TEOS and ozone.

23. A method, comprising:
- forming a patterned etch mask above a semiconducting substrate;
- performing an etching process through said patterned etch mask to thereby form a trench in said substrate;
- performing a first deposition process to form a first layer of insulating material above said patterned etch mask and in said trench, said first layer of insulating material having an as-deposited thickness;
- performing an etching process on said first layer of insulating material such that, after said etching process has been performed, said first layer of insulating material has a post-etch thickness that is about 40-70% of said as-deposited thickness;
- after performing said etching process, performing a second deposition process to form a second layer of insulating material on said etched first layer of insulating material, wherein said second layer of insulating material overfills said trench and wherein performing said second deposition process comprises performing said second deposition process such that a deposition rate during a first portion of said second deposition process is less than 24 nm/min; and
- removing portions of said etched first layer of insulating material and said second layer of insulating material positioned above said patterned etch mask.

24. The method of claim 23, wherein performing said first deposition process comprises performing said first deposition process such that a deposition rate during said first deposition process is less than 24 nm/min.

25. The method of claim 24, wherein performing said first deposition process comprises performing said first deposition process using TEOS and ozone.

26. The method of claim 24, wherein performing said second deposition process comprises performing said second deposition process using TEOS and ozone.

27. The method of claim 24, wherein, after performing said first portion of said second deposition process, performing a second portion of said second deposition process such that the deposition rate during said second portion of said second deposition process is greater than said deposition rate during said first portion of said second deposition process.

28. A method, comprising:
- forming a patterned etch mask above a semiconducting substrate;
- performing an etching process through said patterned etch mask to thereby form a trench in said substrate;
- performing a first deposition process at a first deposition rate of less than 24 nm/min to form a first layer of insulating material above said patterned etch mask and in said trench, said first layer of insulating material having an as-deposited thickness;
- performing an etching process on said first layer of insulating material such that, after said etching process has been performed, said first layer of insulating material has a post-etch thickness that is about 40-70% of said as-deposited thickness;
- after performing said etching process, performing a second deposition process to form a second layer of insulating material on said etched first layer of insulating material, wherein said second layer of insulating material overfills said trench and wherein performing said second deposition process comprises:
  performing a first portion of said second deposition process at a second deposition rate that is less than 24 nm/min; and
  after performing said first portion of said second deposition, performing a second portion of said second deposition process at a third deposition rate that is greater than 24 nm/min; and
removing portions of said etched first layer of insulating material and said second layer of insulating material positioned above said patterned etch mask.

29. The method of claim 28, wherein performing said first deposition process comprises performing said first deposition process using TEOS and ozone.

30. The method of claim 28, wherein performing said first portion of said second deposition process comprises performing said first portion of said second deposition process using TEOS and ozone.

31. The method of claim 30, wherein performing said second portion of said second deposition process comprises performing said second portion of said second deposition process using TEOS and ozone.

* * * * *